United States Patent
Min et al.

(10) Patent No.: US 7,622,389 B1
(45) Date of Patent: Nov. 24, 2009

(54) SELECTIVE CONTACT FORMATION USING MASKING AND RESIST PATTERNING TECHNIQUES

(75) Inventors: Kyunghoon Min, Palo Alto, CA (US); Mark Chang, Los Altos, CA (US); Ning Cheng, San Jose, CA (US); Brian Osborn, San Jose, CA (US); Kevin Song, Santa Clara, CA (US); Fei Wang, San Jose, CA (US); Angela Hui, Fremont, CA (US); Hiroyuki Kinoshita, San Jose, CA (US); Kuo-Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 21 days.

(21) Appl. No.: 11/411,353

(22) Filed: Apr. 25, 2006

(51) Int. Cl.
*H01L 21/302* (2006.01)

(52) U.S. Cl. .................. 438/694; 438/689; 257/315

(58) Field of Classification Search .............. 438/694; 257/315
See application file for complete search history.

(56) References Cited

U.S. PATENT DOCUMENTS

| 5,233,215 A * | 8/1993 | Baliga .................. 257/490 |
| 6,744,105 B1 * | 6/2004 | Chen et al. .............. 257/382 |
| 2005/0269624 A1 * | 12/2005 | Hu et al. ................ 257/315 |

\* cited by examiner

*Primary Examiner*—Nadine Norton
*Assistant Examiner*—Maki Angadi (57) ABSTRACT

A method for manufacturing a semiconductor device including selective conductive contacts includes the step of depositing a resist over first and second memory device components, each of the first and second components comprising junctions formed in the substrate and a gate formed on the substrate between the junctions. The resist is then removed from the second components to thereby form a resist opening above each of the second component control gates and junctions. The resist is then etched to thereby expose each of the first component control gates but not the substrate surrounding the first component control gates. Conductive contacts are then formed on the exposed first component control gates, and the second component control gates and junctions.

20 Claims, 6 Drawing Sheets

SELECTIVE CONTACT FORMATION USING MASKING AND RESIST PATTERNING TECHNIQUES

FIELD OF THE INVENTION

The present invention generally relates to semiconductor device processing, and specifically to methods for fabricating an integrated circuit (IC). More particularly, the present invention relates to methods for fabricating conductive contacts for memory cells and other IC elements.

BACKGROUND OF THE INVENTION

Flash and other types of nonvolatile electronic memory devices are constructed of memory cells that are individually operative to individually store and provide access to binary information or data. In typical nonvolatile electronic memory architectures, each memory cell has a MOS transistor structure including a source, a drain, and a channel formed in a substrate, with a stacked gate structure overlying the channel. The individual memory cells are organized into individually addressable units or groups such as bytes, which comprise eight cells, or words, which may include sixteen or more such cells, usually configured in multiples of eight. Storage of data in such memory device architectures is performed by writing to a particular set of memory cells. Retrieval of data from the cells is accomplished in a read operation. In addition to programming and read operations, groups of cells in a memory device may be erased, wherein each cell in the group is programmed to a known state. The bytes or words of memory cells are accessed for read, program, or erase operations through address decoding circuitry using conductive interconnects typically referred to as wordlines and bitlines.

Figure 1:
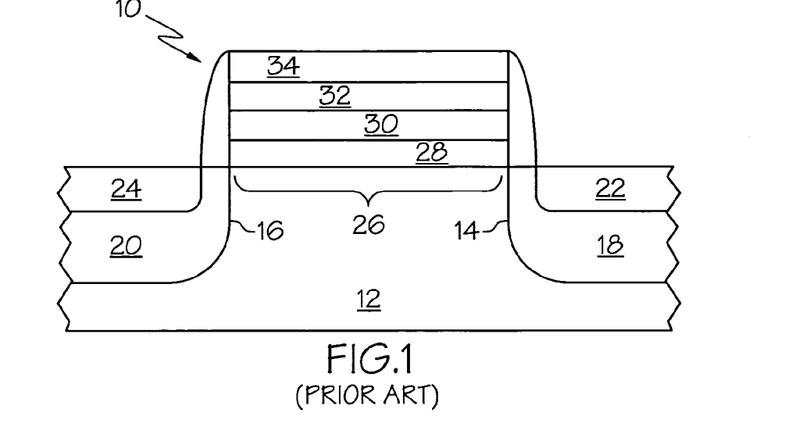
FIG. 1 is a cross-sectional view of a conventional memory cell.

FIG. 1 is a cross-sectional view of just one of many conventional memory cells. The cell 10 is formed on a substrate 12, having a heavily doped drain region 14 and source region 16 embedded therein. The drain and source regions 14 and 16 typically contain deep diffused regions 18 and 20 that are lightly doped, and shallow diffused regions 22 and 24 that are more highly doped. A channel region 26 separates the drain region 14 from the source region 16. The cell 10 typically is characterized by a vertical gate stack, and the conventional gate stack configuration depicted in FIG. 1 includes a tunnel oxide layer 28, a floating gate 30 over the tunnel oxide layer, an interlevel dielectric layer 32, and a control gate 34 over the interlevel dielectric layer. Numerous other gate stack configurations for flash memory devices are also known in the art.

Figure 2:
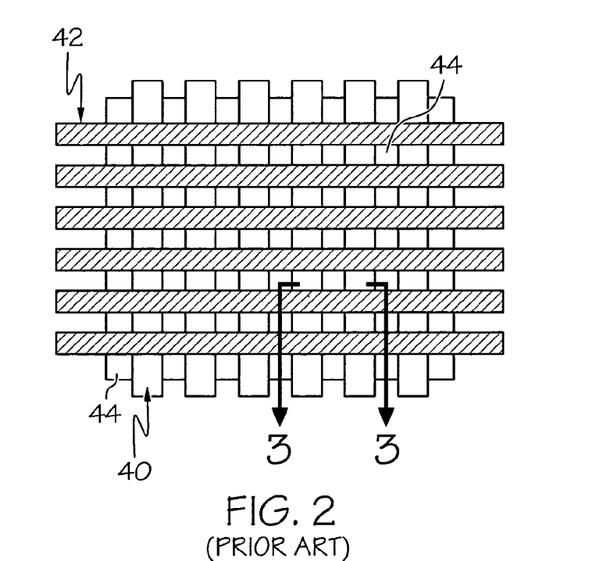
FIG. 2 is a top schematic view of a conventional IC device depicted as having doped junctions that are formed in vertical direction, with horizontal control gates.
Figure 3:
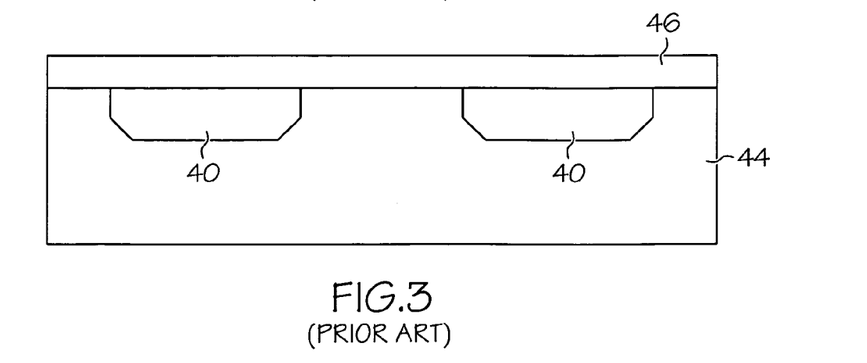
FIG. 3 is a cross-sectional view of a conventional IC device along line 3-3 in FIG. 2, and depicts contact material deposited onto the doped junctions and also onto the adjacent exposed silicon.

During IC fabrication, a conductive contact such as a metal silicide is deposited or otherwise formed on the control gate 34, source region 16, and/or the drain region 14 to access the memory device and allow interconnections between the memory device and other IC devices. At times there may be some exposed IC elements that should not be covered with a metal silicide or other contact material. For example, FIG. 2 is a top schematic view of an IC device having doped junctions 40 that are formed in a vertical direction (as illustrated), with horizontal word line control gates 42 formed over the junctions 40. Areas between the doped junctions 40 may include exposed silicon 44. Depositing metal silicide or other contact material onto the exposed silicon 44 could be detrimental to the device performance. FIG. 3 is a cross-sectional view along line 3-3 in FIG. 2, and depicts contact material 46 deposited onto the doped junctions 40 and also onto the adjacent exposed silicon 44. In this case, indiscriminately forming metal silicide or other contact material 46 may create an electrical short between the junctions 40 or produce other undesirable effects.

Accordingly, it is desirable to provide a method that enables selective formation of metal silicide or other contact material to avoid metal deposition in undesirable memory device regions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with a first exemplary method for selectively fabricating conductive contacts onto active elements of a memory device, a resist is deposited over first and second memory device components. Each of the first and second components comprises junctions formed in the substrate and a control gate formed on the substrate between the junctions. The resist is removed from the second components to thereby expose each of the second component control gates and junctions. The resist is also etched to thereby expose each of the first component control gates, but not the substrate surrounding the first component control gates. Then, conductive contacts are formed on the exposed first component control gates, and also on the second component control gates and junctions.

In accordance with a second exemplary method for selectively fabricating conductive contacts onto active elements of a memory device, a first layer of resist is deposited over first and second memory device components. Each of the first and second components comprises junctions formed in the substrate and a control gate formed on the substrate between the junctions. The first layer of resist is polished to thereby expose at least the first component control gates, but not the substrate surrounding the first component control gates. A second layer of resist is deposited onto the first layer of resist and over the first components, leaving an exposed region of the first resist surrounding the second components. The entire second layer of resist and the exposed region of the first layer of resist are simultaneously removed to thereby expose each of the second component control gates and junctions. Conductive contacts are then formed on the exposed first component control gates, and also on the second component control gates and junctions.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 4:
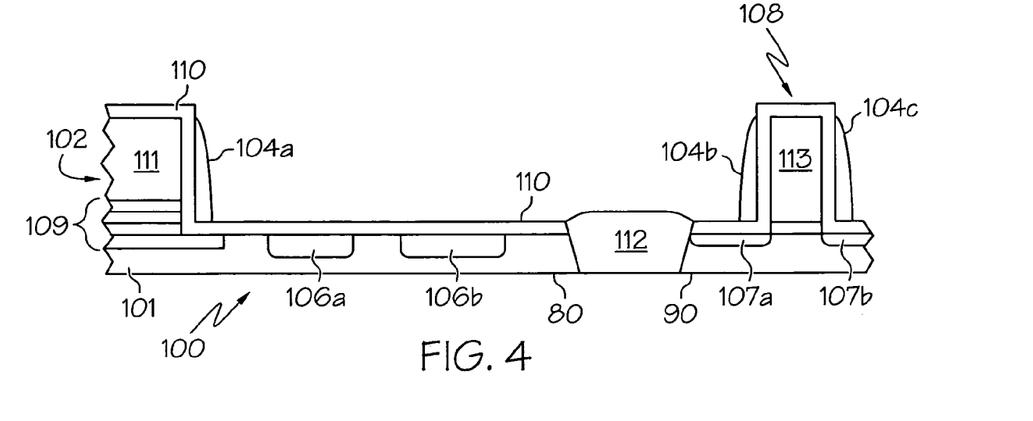
FIGS. 4 to 10 are cross-sectional views illustrating a portion of a memory device at various formation stages, and collectively depict, in accordance with a first exemplary embodiment of the present invention, a method for fabricating the device.

Referring to FIG. 4, a portion of a memory device 100 is illustrated. In accordance with an exemplary embodiment of the present invention, the memory device 100 is an N-channel NAND flash memory device, although the invention applies to any suitable memory device architecture. Further, the invention applies to any suitable IC device for which selective metal silicide formation is desirable. The depicted memory device 100 includes a core memory region 80 having wordlines, bitlines, and other active elements, and a peripheral region 90 having other active elements including logic transistors. A dielectric material, such as a trench isolation oxide 112, is formed in the memory device substrate 101 and separates the peripheral region 90 from the core memory region 80.

An exemplary core memory cell 102 for a word line is included in the memory region 80, and other IC elements 106a and 106b are positioned near the cell 102. For example, the IC elements 106a and 106b may be doped junctions, or other active elements. A logic transistor 108 is included in the peripheral region 90 and is separated from the cell 102 and IC elements 106a and 106b by the trench isolation oxide 112. The depicted cell 102, IC elements 106a and 106b, and logic transistor 108 are merely representative of numerous active elements that may be included in the memory device 100.

The logic transistor 108 includes a gate 113, and source and drain regions 107a and 107b, which are formed spaced apart at the substrate surface and extend into the substrate 101. As with the cell 102, the logic transistor 108 and the other IC elements 106a and 106b are formed on and/or in the silicon substrate 101. As used herein, the term "silicon substrate" will be used to encompass the relatively pure silicon materials typically used in the semiconductor industry as well as silicon admixed with other elements such as germanium, carbon, and the like. The substrate 101 may be a bulk silicon wafer or a thin layer of silicon on an insulating layer (commonly known as a silicon-on-insulator wafer or SOI wafer) that, in turn, is supported by a silicon carrier wafer. The substrate 101 may be doped to create an overall P-type monocrystalline semiconductor material.

Sidewall spacers are also formed astride the various IC elements as diffusion barriers and to assist in controlling the channel length between a source and a drain. Common insulation materials for forming the sidewall spacers include silicon dioxide and silicon nitride, and the sidewall spacers may be formed using known deposition and etchback processes. In the depicted embodiment, the sidewall spacers are bi-layers of a silicon dioxide layer 110 and a silicon nitride layer, which is selectively etched to form sidewall sections 104a to 104c. The silicon dioxide layer 110 is deposited astride the IC elements 102 and 108, and also on the exposed substrate 101. By depositing and selectively etching only the silicon nitride layer, the silicon dioxide layer 110 remains on the substrate 101 and top of gates 111 and 113.

The word line core cell 102 may include a multi-layer dielectric stack 109 such as, for example, a multilayer oxide-nitride-oxide (ONO) stack, overlying the substrate 101 and underlying a gate material 111 such as polysilicon. The stack layers may be formed using any appropriate process steps and materials, including oxidation and/or deposition techniques as are known. Further, various insulative, dielectric, and metals for the various IC elements 102 and 108 may be deposited and processed using known techniques such as chemical vapor deposition (CVD), low pressure chemical vapor deposition (LPCVD), plasma enhanced chemical vapor deposition (PECVD), and atomic layer deposition (ALD).

As previously discussed, a conductive contact is commonly deposited or otherwise formed on gate, source, and the drain regions of various memory devices to allow for access to, and interconnections between, the memory devices and other IC devices. For example, contacts may be formed on at least the gates 111 and 113 for the word line core cell 102 and logic transistor 108 depicted in FIG. 4, and also on the source and drain regions 107a and 107b for the logic transistor 108. However, the IC being implemented may require that the exposed IC elements 106a and 106b should not be covered with that same contact material. It is also undesirable for conductive contact material to be deposited on some areas of the substrate 101. Continuing with FIGS. 5 to 10, a method is depicted for selectively forming metal silicide layers on a plurality of IC components, while protecting areas where metal deposition is either unnecessary or potentially detrimental to the IC performance.

Figure 5:
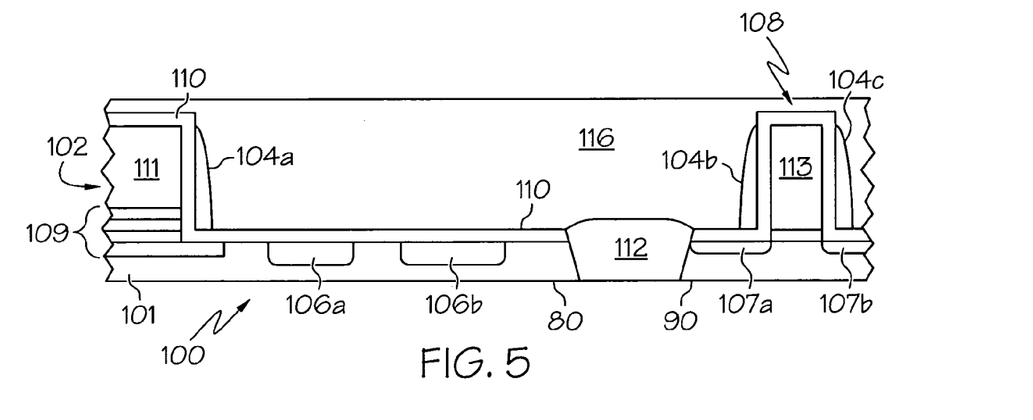

As depicted in FIG. 5, a layer of resist 116 or other masking polymer is deposited onto the substrate 101 and the various components formed thereon. A conventional spinning application process is an exemplary method for depositing the resist 116. Heat is applied to the resist 116 after it is deposited in order to remove existing solvents. An exemplary resist 116 is a positive photoresist that, upon application, is insoluble in a particular photoresist developer but becomes soluble when exposed to radiation in a prescribed wavelength range. An organic polymer material, such as a mixture of diazonaphthoquinone and novolaks resin (a phenol formaldehyde resin), is one exemplary type of positive resist although other conventional polymers and resist materials may also be deposited.

Figure 6:
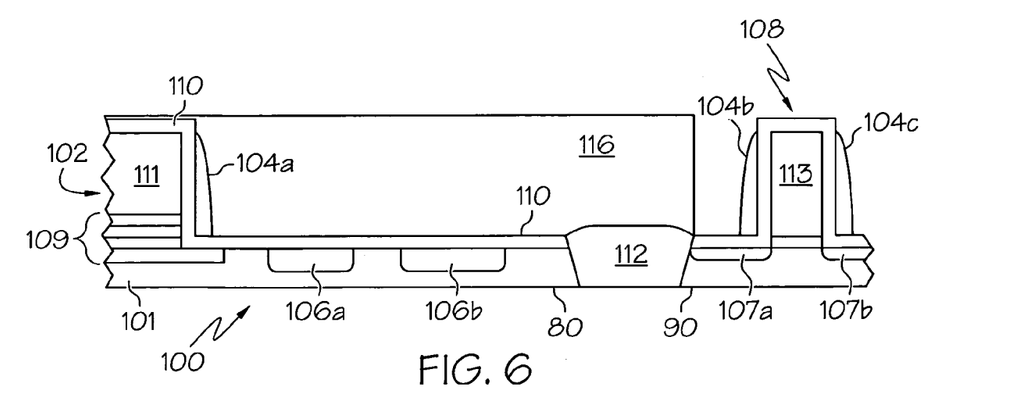

After performing the depositing and drying steps, the resist 116 is selectively removed from the substrate 101 and the various components formed thereon. FIG. 6 depicts the resist 116 removed from the peripheral region 90 to the right of the trench isolation oxide 112, exposing the peripheral logic transistor 108. The core cell 102 and the IC elements 106a and 106b remain covered by the resist 116. If the resist is a positive photoresist, removal is performed by covering regions where resist should remain and exposing the uncovered resist to radiation of a particular wavelength range. As previously described, the exposed resist is chemically altered by exposure to the radiation, and consequently becomes soluble in a resist developer that removes the altered resist. Following selective resist removal, the resist layer remains both on regions where metal silicide contacts will be subsequently formed, including the core cell gate 111, and also on selected regions where subsequent metallic contact formation will not occur. For example, conductive metal formation on the substrate 101 surrounding the core cell 102 and/or the regions between IC elements 106a and 106b may result in short circuits or other operational failures. Resist 116 therefore remains disposed over the IC elements 106a and 106b and the surrounding substrate 101 as depicted in FIG. 6.

Figure 7:
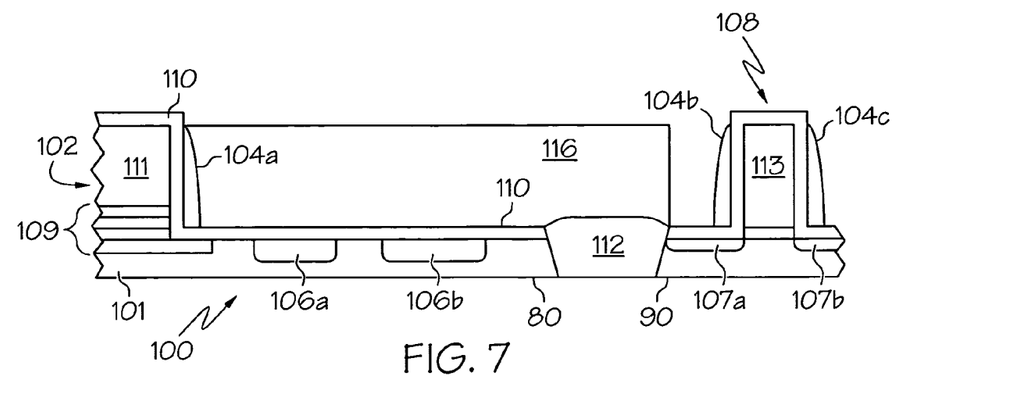

In addition to the selective resist removal process, a dry etching procedure is performed to reduce the resist layer thickness and thereby expose the core memory cell gates such as gate 111, which will need to be exposed during subsequent metal deposition. FIG. 7 depicts the resist 116 following a dry etching procedure. As shown, some selected core regions remain covered with resist, including the IC elements 106a and 106b and the substrate 101 surrounding the memory cell gate 111. One exemplary reagent for the dry etching of resist is a mixture of $O_2$ and Ar gas.

After depositing, selectively removing, and dry etching the resist 116, a wet etching step is performed to pre-clean the overall device and remove exposed silicon dioxide 110 surrounding the peripheral logic transistor 108. The wet-etching step also removes any silicon dioxide that may be formed on top of the core memory cell gate 111 and/or the logic transistor gate 113 to ensure that the subsequent contact will be completely and reliably formed on the gates 111 and 113, and also on the source and drain regions 107a and 107b. Exemplary etchants for the etching step are isotropic. Liquid etchants such as diluted hydrofluoric acid, nitric acid, phosphoric acid, and solutions including one or more of such etchants may be tailored to best etch the particular materials and structures being processed. As illustrated in FIG. 7, the remaining resist layer 116 protects some areas where it is undesirable to remove the silicon dioxide layer 110. Also, the illustrated embodiment includes dual layered sidewall spacers astride the core memory cell 102 and the logic transistor 108, with the silicon dioxide layer 110 forming inner sidewall layers. Upper regions of the silicon dioxide layer 110 forming the inner sidewall layers are exposed to the etchants, but removal of only a small amount of such upper regions will not be detrimental to the component performances.

Figure 8:
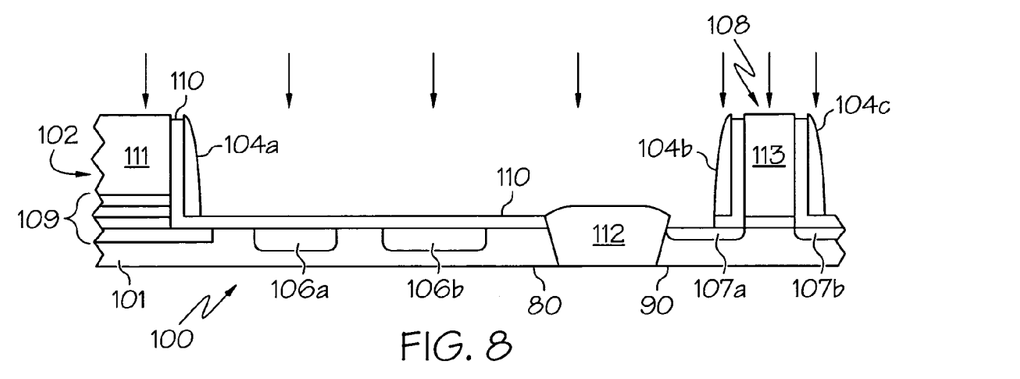
Figure 9:
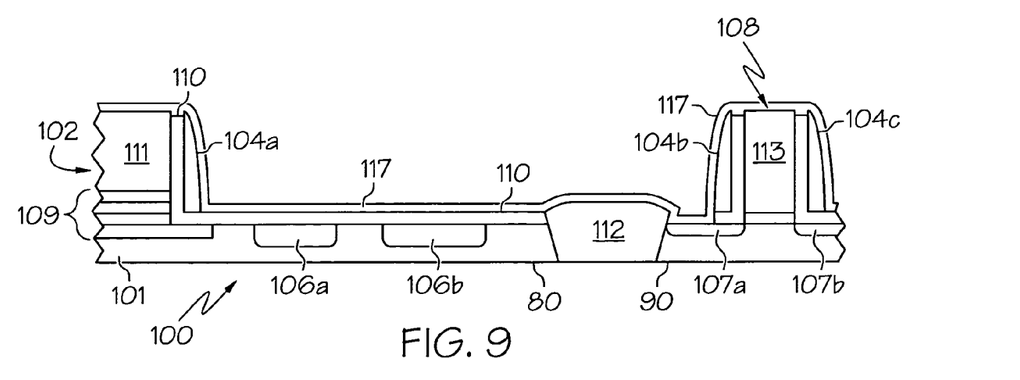

After selectively removing the silicon dioxide layer 110, the remaining layer of resist 116 is stripped off by either a dry etching using reactant gas such as $O_2$ plasma or by exposure to a wet etching solution such as $H_2O_2/H_2SO_4$. FIG. 8 depicts the memory device 100 following selective removal of the silicon dioxide 110 and the layer of resist 116.

Having removed all of the resist 116, a metal is deposited by blanket deposition over the entire memory device 100 as depicted by the downward-pointing arrows. FIG. 8 depicts metal being deposited unselectively, even though metal silicide will only be formed on the region on and surrounding the peripheral logic transistor gate 113, and also onto the core memory cell gate 111. The preserved oxide 110 in the core memory cell region prevents reactions between the deposited metal and silicon in the substrate 101. Upon depositing the metal, the overall structure represents the configuration depicted in FIG. 9, with a metal layer 117 formed over the entire structure. Exemplary metals include cobalt, nickel, titanium, tantalum, platinum, palladium, rhodium, and mixtures of the metals. The metal may be deposited, for example, using known chemical and/or physical vapor deposition methods.

Figure 10:
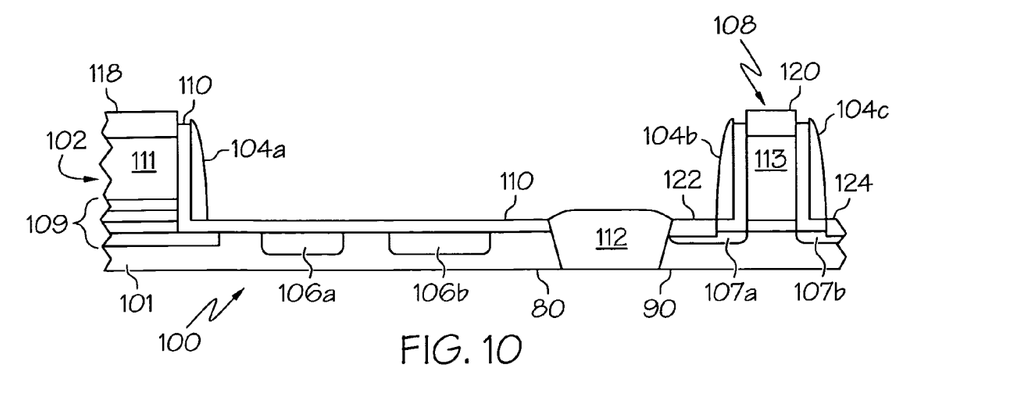

A thermal annealing process is performed to form metal silicides on the exposed silicon and polysilicon regions, including the source and drain regions 107a and 107b and the gates 111 and 113. A thin layer of the metal 117 will form metal silicide by heating the structure to a few hundred degrees Celsius to react the metal with the underlying silicon or polysilicon, resulting in the formation of metal silicide contacts. The metal deposited on the remaining oxide 110 in the core memory cell region, as well as on the trench isolation 112 and the sidewall spacers 104a to 104c, remains unreacted and is removed by exposure to a wet etching solution such as $H_2O_2/H_2SO_4$ or $HNO_3/HCl$ solutions. FIG. 10 depicts the memory device 100 following formation of metal silicide contacts 118, 120, 122, and 124 over the core word line gate 111 and the exposed elements of the peripheral logic transistor 108, and after stripping off any remaining unreacted metal.

According to a further embodiment of the invention, the patterned resist 116 depicted in FIG. 7, or other masking polymer, is not stripped until after depositing the metal and reacting it with the silicon or polysilicon to form the metallic contacts 118, 120, 122, and 124 over the core word line gate 111 and the exposed elements of the logic transistor 108. The resist 116 isolates selected portions of the substrate and active components from the metal and thereby prevents a silicate-forming reaction during the annealing process. In accordance with this embodiment, the silicide forming annealing temperature should be compatible with the resist being employed.

Figure 11:
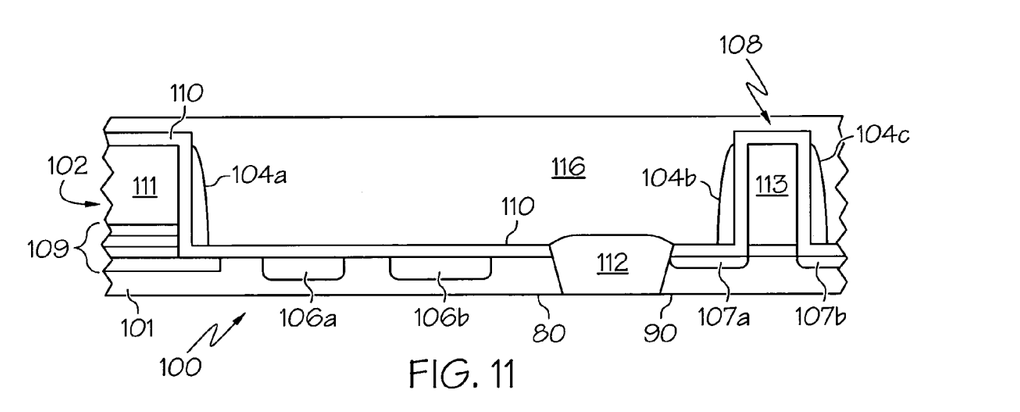
FIGS. 11 to 17 are cross-sectional views illustrating a portion of a memory device at various formation stages, and collectively depict, in accordance with a second exemplary embodiment of the present invention, a method for fabricating the device.

FIGS. 11 to 17 depict yet another exemplary method for selectively forming metal silicide or other contact material on a plurality of IC components, while protecting areas where metal deposition is either unnecessary or potentially detrimental to the IC performance. FIG. 11 depicts a portion of a memory device 100 that includes the same components illustrated in the prior method, including the core cell 102 for a word line, IC elements 106a and 106b positioned near the cell 102, and the peripheral logic transistor 108 separated from the cell 102 and IC elements 106a and 106b using a trench isolation device 112. As in the prior method, the resist layer 116, such as a non-photosensitive polymer resin is formed over the entire substrate 101 and the associated exposed IC components. More particularly, the resist layer 116 is formed over the core memory region 80 including the depicted word line cell 102 and the IC components 106a and 106b, and the peripheral region 90 including the peripheral logic transistor 108 and the surrounding substrate regions. A mask is not necessarily used for depositing or removing any resist 116 up to this point since there are no selective substrate region or active element components that are to be exposed immediately following resist deposition.

Figure 12:
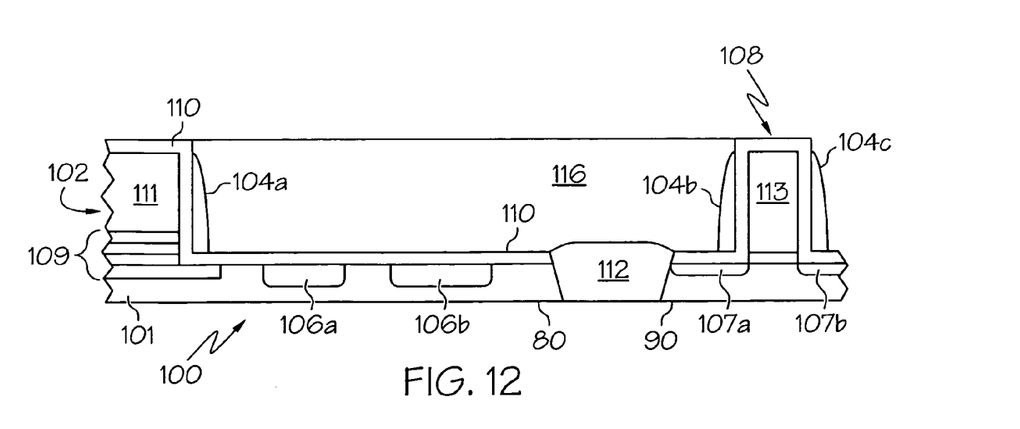

After depositing the layer of resist 116, a chemical mechanical polish (CMP) is performed on the resist layer 116. As depicted in FIG. 12, the resist layer 116 is substantially planar after performing the CMP process, which exposes the core word line cell gate 111. The peripheral memory cell gate 113 is also exposed if it is approximately the same height as the word line cell gate 111.

Figure 13:
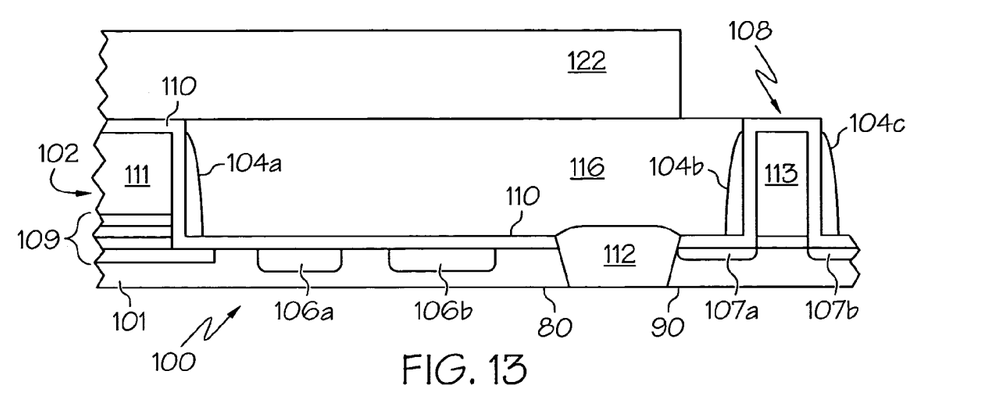

A second layer of resist 122 or other polymer is formed on top of the first layer of resist 116 and over the same regions that were covered using the resist layer 116 in the prior method at the step depicted in FIG. 6. More particularly, and as depicted in FIG. 13, the second resist layer 122 is deposited over the core memory region 80, including the word line core cell 102, the IC elements 106a and 106b, and the surrounding substrate 101. In an exemplary embodiment, the second layer of resist 122 is blanket deposited onto the first layer of resist 116 and patterned using a similar masking technique described in the first exemplary method. An exemplary resist 122 is a positive photoresist that becomes soluble in a particular photoresist when exposed to radiation in a prescribed wavelength range. An organic polymer material, such as a mixture of diazonaphthoquinone and novolaks resin (a phenol formaldehyde resin), is one exemplary type of positive resist although other conventional polymers and resist materials may also be deposited. The second resist layer is preferably a material that can be removed using the same etchant as the first layer of resist 116.

Upon forming the second resist layer 122, a dry etching step is performed to remove the entire second resist layer 122, and to simultaneously remove the regions of the first resist layer 116 that were not covered by the second resist layer 122 when the etchant was applied. Upon completing the etching step, the overall device 100 has the structure depicted in FIG. 14, with the resist 116 removed from the peripheral region 90 to the right of the trench isolation oxide 112, exposing the peripheral logic transistor 108. The core memory cell gates are also exposed, including gate 111. Some selected core regions remain covered with resist, including the IC elements 106a and 106b and the substrate 101 surrounding the memory cell gate 111.

Figure 14:
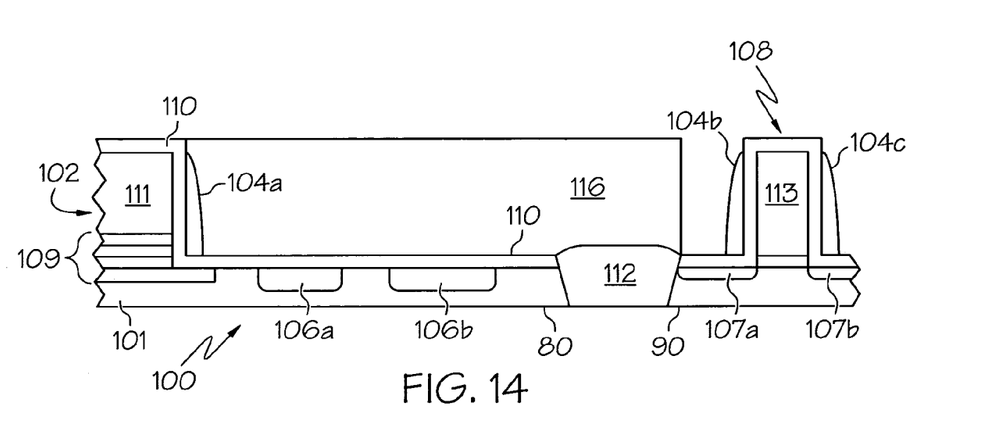

After depositing and selectively removing and dry etching the first layer of resist 116 using the second layer of resist 122 as a mask, a wet etching step is performed to pre-clean the overall device and remove exposed silicon dioxide 110 surrounding the peripheral logic transistor 108. The etching step also removes any silicon dioxide that may be formed on top of the core memory cell gate 111 and/or the logic transistor gate 113. The pre-cleaning step is performed to ensure that the subsequent contact will be completely and reliably formed on the gate 113 and the source and drain regions 107a and 107b. As illustrated in FIG. 14, the remaining resist layer 116 protects some areas where it is undesirable to remove the silicon dioxide layer 110. Also, the illustrated embodiment includes dual layered sidewall spacers astride the core memory cell 102 and the logic transistor 108, with the silicon dioxide layer 110 forming inner sidewall layers. Upper regions of the silicon dioxide layer 110 forming the inner sidewall layers are exposed to the etchants, but removal of only a small amount of such upper regions will not be detrimental to the component performances.

Figure 15:
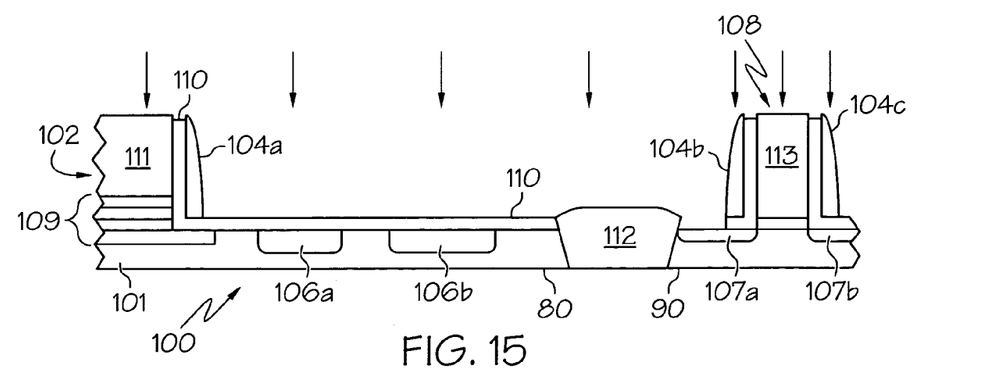
Figure 16:
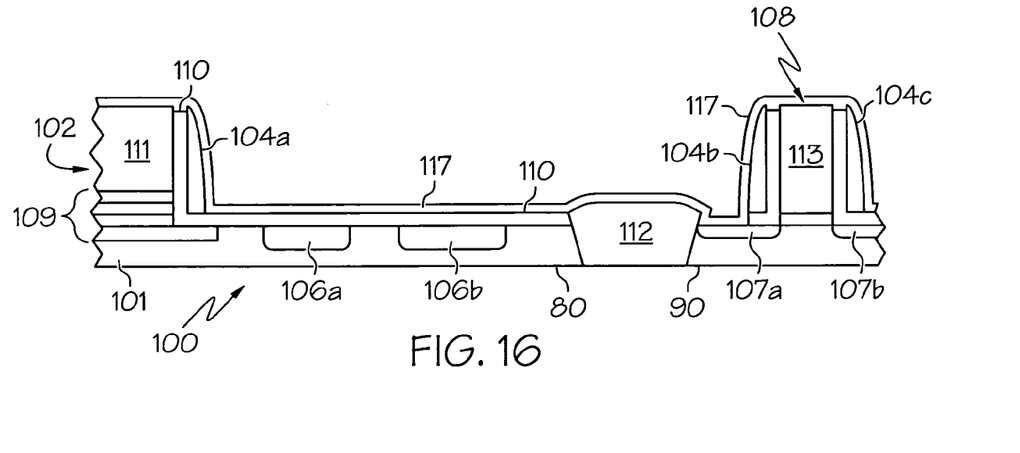

After selectively removing the silicon dioxide layer 110, the remaining layer of resist 116 is stripped off by either a dry etching using reactant gas such as $O_2$ plasma or by exposure to a wet etching solution such as $H_2O_2/H_2SO_4$. FIG. 15 depicts the memory device 100 following selective removal of the silicon dioxide 110 and the layer of resist 116.

Having removed all of the resist 116, a metal is deposited unselectively over the entire memory device 100. FIG. 15 depicts downward arrows representing being deposited unselectively, even though metal silicide will only be formed on the region on and surrounding the peripheral logic transistor gate 113, and also onto the core memory cell gate 111. The preserved oxide 110 in the core memory cell region prevents reactions between the deposited metal and silicon in the substrate 101. Upon depositing the metal, the overall structure represents the configuration depicted in FIG. 16, with a metal layer 117 formed over the entire structure. The metal may be deposited using known chemical and/or vapor deposition methods, or other suitable metal deposition processes.

Figure 17:
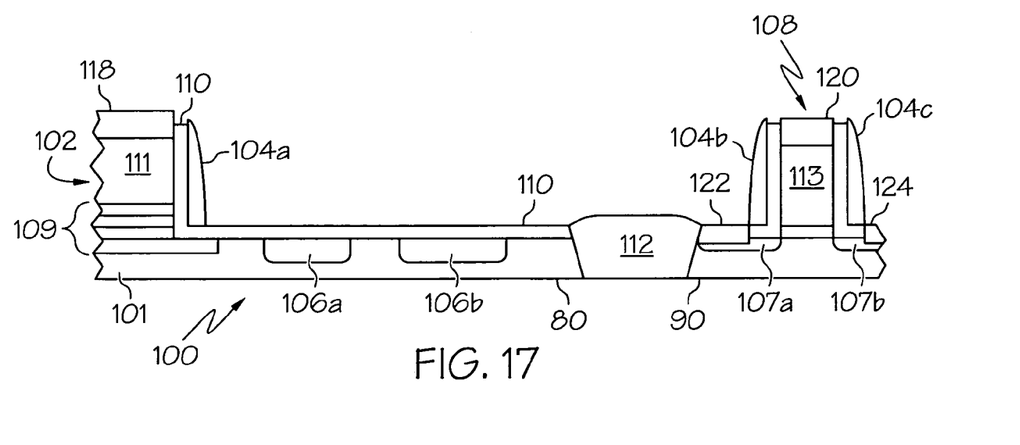

A thermal annealing process is performed to form metal silicides on the exposed silicon and polysilicon regions, including the source and drain regions 107a and 107b and the gates 111 and 113. A thin layer of the metal 117 will form metal silicide by heating the structure to a few hundred degrees Celsius to react the metal with the underlying silicon or polysilicon, resulting in the formation of metal silicide contacts. The metal deposited on the remaining oxide 110 in the core memory cell region remains unreacted, and is removed by exposure to a wet etching solution such as $H_2O_2/H_2SO_4$ or $HNO_3/HCl$ solutions. FIG. 17 depicts the memory device 100 following formation of metal silicide contacts 118, 120, 122, and 124 over the core word line gate 111 and the exposed elements of the peripheral logic transistor 108, and after stripping off any remaining resist.

According to an alternate method, the strip of resist 116 depicted in FIG. 14, or other masking polymer, is not stripped until after depositing the metal and reacting it with the silicon or polysilicon to form the metallic contacts 118, 120, 122, and 124 over the core word line gate 111 and the exposed elements of the logic transistor 108. The resist 116 isolates the exposed substrate and active components from the metal and thereby prevents a reaction during the annealing process. In this case, the silicide forming annealing temperature should be compatible with the resist being employed.

Thus, in accordance with the various embodiments of the present invention, a memory device may be formed by selectively forming metal silicides in predetermined substrate regions. In so doing, the method avoids formation of metallic contacts in regions that are undesirable or that may be detrimental to the device performance. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for manufacturing a semiconductor device including selective conductive contacts, the method comprising:

depositing a resist over first and second memory device components, each of the first components comprising a gate formed on a substrate, and each of the second components comprising junctions formed in the substrate and a gate formed on the substrate between the junctions;

removing the resist from the second components, and thereby forming a resist opening above each of the second component control gates and junctions;

etching the resist after the step of removing and exposing each of the first component control gates but not the substrate surrounding the first component control gates; and forming conductive contacts on the exposed first component control gates, and the second component control gates and junctions.

2. The method according to claim 1, wherein the memory device comprises a core region having wordlines and bitlines formed from at least some of the first components, and a peripheral region having logic elements formed from at least some of the second components, the step of depositing a resist over first and second memory device components includes depositing the resist over both the core region and the peripheral region, and the step of removing the resist from the second components includes removing the resist from the entire peripheral region.

3. The method according to claim 2, wherein the core region includes doped junctions embedded in the substrate, and wherein the step of depositing a resist over first and second memory device components includes depositing the resist over the doped junctions.

4. The method according to claim 1, wherein the step of etching the resist comprises a dry etching process.

5. The method according to claim 1, wherein the step of forming conductive contacts comprises:

depositing metal onto the exposed first component control gates, and also onto the second component control gates and junctions; and reacting the metal with a silicon-containing material included in the first component control gates and the second component control gates and junctions, to form conductive metal silicide contacts.

6. The method according to claim 5, wherein the step of depositing metal comprises depositing a metal selected from the group consisting of cobalt, nickel, titanium, tantalum, platinum, palladium, rhodium, and mixtures thereof.

7. The method according to claim 1, wherein the step of removing the resist from the second components exposes any oxide formed on each of the second component control gates and junctions, and the step of etching the resist exposes any oxide formed on the first component control gates, the method further comprising:

etching any oxide formed on each of the second component control gates and junctions, and any oxide formed on the first component control gates before the step of forming the conductive contacts.

8. The method according to claim 1, further comprising the step of:

forming an oxide at least on the substrate surrounding the first component control gates prior to forming the conductive contacts.

9. The method according to claim 8, further comprising the step of:

stripping the resist from the substrate surrounding the first component control gates to expose the oxide formed thereon prior to the step of forming the conductive contacts.

10. The method according to claim 1, further comprising the step of:

stripping the resist from the substrate surrounding the first component control gates after the step of forming the conductive contacts.

11. A method for manufacturing a semiconductor device including selective conductive contacts, the method comprising:

depositing a first layer of resist over first and second memory device components, each of the first components comprising a control gate formed on a substrate, and each of the second components comprising junctions formed in the substrate and a control gate formed on the substrate between the junctions;

polishing the first layer of resist and thereby exposing at least the first component control gates but not the substrate surrounding the first component control gates;

depositing a second layer of resist onto the first layer of resist and over the first components, leaving an exposed region of the first resist surrounding the second components;

simultaneously removing the entire second layer of resist, and the exposed region of the first layer of resist, and thereby exposing each of the second component control gates and junctions; and forming conductive contacts on the exposed first component control gates, and the second component control gates and junctions.

12. The method according to claim 11, wherein the memory device comprises a core region having wordlines and bitlines formed from at least some of the first components, and a peripheral region having logic elements formed from at least some of the second components, the step of depositing a first layer of resist over first and second memory device components includes depositing the resist over both the core region and the peripheral region, and the step of removing the exposed region of the first layer of resist includes removing the first layer of resist from the entire peripheral region.

13. The method according to claim 12, wherein the core region includes doped junctions embedded in the substrate, and wherein the step of depositing a first layer of resist over first and second memory device components includes depositing the resist over the doped junctions.

14. The method according to claim 11, wherein the step of polishing the resist comprises a chemical-mechanical polishing process.

15. The method according to claim 11, wherein the step of forming conductive contacts comprises:

depositing metal onto the exposed first component control gates, and also onto the second component control gates and junctions; and reacting the metal with a silicon-containing material included in the first component control gates and the second component control gates and junctions, to form conductive metal silicide contacts.

16. The method according to claim 15, wherein the step of depositing metal comprises depositing a metal selected from the group consisting of cobalt, nickel, titanium, tantalum, platinum, palladium, rhodium, and mixtures thereof.

17. The method according to claim 11, wherein the step of simultaneously removing the entire second layer of resist, and the exposed region of the first layer of resist, exposes any oxide formed on each of the second component control gates and junctions, and any oxide formed on the first component control gates, the method further comprising:

etching any oxide formed on each of the second component control gates and junctions, and any oxide formed on the first component control gates before the step of forming the conductive contacts.

18. The method according to claim 11, further comprising the step of:

forming an oxide at least on the substrate surrounding the first component control gates prior to forming the conductive contacts.

19. The method according to claim 18, further comprising the step of:

stripping the first layer of resist from the substrate surrounding the first component control gates to expose the oxide formed thereon prior to the step of forming the conductive contacts.

20. The method according to claim 11, further comprising the step of:

stripping the first layer of resist from the substrate surrounding the first component control gates after the step of forming the conductive contacts.

* * * * *